(12) United States Patent
Ho et al.

(10) Patent No.: US 10,510,126 B2
(45) Date of Patent: Dec. 17, 2019

(54) ENERGY CONSUMPTION ALERTING SYSTEM, PLATFORM AND METHOD

(71) Applicant: Global Design Corporation Ltd., Hong Kong (HK)

(72) Inventors: Yung Fai Ho, Hong Kong (HK); Dirk Beiner, Paderborn (DE)

(73) Assignee: GLOBAL DESIGN CORPORATION LTD., Hong Kong (HK)

( * ) Notice: Subject to any disclaimer, the term of this patent is extended or adjusted under 35 U.S.C. 154(b) by 541 days.

(21) Appl. No.: 14/929,074

(22) Filed: Oct. 30, 2015

(65) Prior Publication Data

US 2017/0124667 A1 May 4, 2017

(51) Int. Cl.
*G01R 22/06* (2006.01)
*G01R 22/10* (2006.01)
*G06Q 50/06* (2012.01)
*G08B 21/18* (2006.01)
*G01R 21/133* (2006.01)

(52) U.S. Cl.
CPC ......... *G06Q 50/06* (2013.01); *G01R 21/1333* (2013.01); *G01R 22/063* (2013.01); *G01R 22/10* (2013.01); *G08B 21/182* (2013.01)

(58) Field of Classification Search
CPC ..... H04L 67/10; H04L 12/2816; H04L 67/12; G01R 22/063
USPC ...................... 700/291, 295; 702/61, 62, 182
See application file for complete search history.

(56) References Cited

U.S. PATENT DOCUMENTS

| 7,974,913 | B1 | 7/2011 | Morozov et al. |
| 9,800,646 | B1 * | 10/2017 | Stamatakis ........... H04L 67/025 |
| 2003/0101009 | A1 | 5/2003 | Seem |

(Continued)

FOREIGN PATENT DOCUMENTS

| CN | 102354178 A | 2/2012 |
| CN | 102969796 A | 3/2013 |

(Continued)

OTHER PUBLICATIONS

Cleveland, R. B., et al., "STL: A Seasonal-Trend Decomposition Procedure Based on Loess," Journal of Official Statistics, vol. 6, No. 1, Mar. 1990, pp. 1-33.

(Continued)

*Primary Examiner* — John E Breene
*Assistant Examiner* — Jeffrey P Aiello
(74) *Attorney, Agent, or Firm* — Slater Matsil, LLP

(57) ABSTRACT

An energy consumption alerting system is provided. The system includes a plurality of sensors deployed at different locations of at least one monitored site, the sensors being able to provide location-specific energy consumption values. The system further includes a data aggregation facility so as to sum up location-specific energy consumption values associated with at least two corresponding predetermined sensors of the plurality of sensors to obtain an aggregated energy consumption value. The system further includes an alerting facility this is able to compare the aggregated energy consumption value with an user-defined threshold level and notify a user if the at least one aggregated energy consumption value exceeds the at least one user-defined threshold level. A cloud-based energy consumption alerting platform and an energy consumption alerting method are also provided.

20 Claims, 8 Drawing Sheets

(56) References Cited

U.S. PATENT DOCUMENTS

| | | |
|---|---|---|
| 2004/0102937 A1 | 5/2004 | Ibrahim |
| 2005/0090995 A1 | 4/2005 | Sonderegger |
| 2005/0171645 A1* | 8/2005 | Oswald ................ G05B 15/02 700/276 |
| 2008/0109387 A1* | 5/2008 | Deaver ............ G01R 19/16547 705/412 |
| 2009/0157573 A1 | 6/2009 | Anderson et al. |
| 2010/0030617 A1 | 2/2010 | Handley |
| 2010/0274602 A1 | 10/2010 | Kaufman et al. |
| 2011/0040785 A1 | 2/2011 | Steenberg et al. |
| 2012/0143383 A1* | 6/2012 | Cooperrider ............. H04Q 9/00 700/295 |
| 2012/0158631 A1 | 6/2012 | Pitcher et al. |
| 2012/0259583 A1 | 10/2012 | Noboa et al. |
| 2012/0316693 A1* | 12/2012 | Ogawa ..................... H02J 3/14 700/295 |
| 2013/0066479 A1 | 3/2013 | Shetty et al. |
| 2013/0262197 A1 | 10/2013 | Kaulgud et al. |
| 2014/0058572 A1 | 2/2014 | Stein et al. |
| 2014/0062707 A1 | 3/2014 | Hong et al. |
| 2014/0074311 A1* | 3/2014 | Kearns ..................... H02J 3/38 700/297 |
| 2014/0200763 A1 | 7/2014 | Sisk |
| 2014/0222394 A1 | 8/2014 | Drees et al. |
| 2015/0100167 A1* | 4/2015 | Sloo ....................... G01N 27/02 700/278 |
| 2015/0178633 A1 | 6/2015 | ElBsat et al. |
| 2015/0178865 A1 | 6/2015 | Anderson et al. |
| 2015/0256401 A1* | 9/2015 | Zinger ................... H04L 41/14 370/401 |
| 2015/0261963 A1 | 9/2015 | Ukil et al. |
| 2016/0055419 A1 | 2/2016 | Fischer et al. |
| 2016/0187449 A1* | 6/2016 | Beiner ................ G01R 35/005 324/74 |
| 2016/0370830 A1* | 12/2016 | Miller ..................... H02J 9/061 |
| 2017/0090004 A1* | 3/2017 | Marshall ............. G01R 21/133 |

FOREIGN PATENT DOCUMENTS

| | | |
|---|---|---|
| CN | 103018582 A | 4/2013 |
| CN | 103236102 | 8/2013 |
| CN | 103543309 A | 1/2014 |
| CN | 103676819 A | 3/2014 |
| CN | 104239982 A | 12/2014 |
| CN | 104615119 A | 5/2015 |
| KR | 20100125809 A | 12/2010 |
| KR | 101321622 B1 | 10/2013 |
| KR | 101336571 B1 | 12/2013 |

OTHER PUBLICATIONS

Grubbs, F. E., "Procedures for Detecting Outlying Observations in Samples," Technometrics, vol. 11, No. 1, Feb. 1969, pp. 1-22.

Hoerl, A. E., et al., "Ridge Regression: Biased Estimation for Nonorthogonal Problems," Technometrics, vol. 12, No. 1, Feb. 1970, pp. 55-67.

Rosner, B., "Percentage Points for a Generalized ESD Many-Outlier Procedure," Technometrics, vol. 25, No. 2, May 1983, pp. 165-172.

* cited by examiner

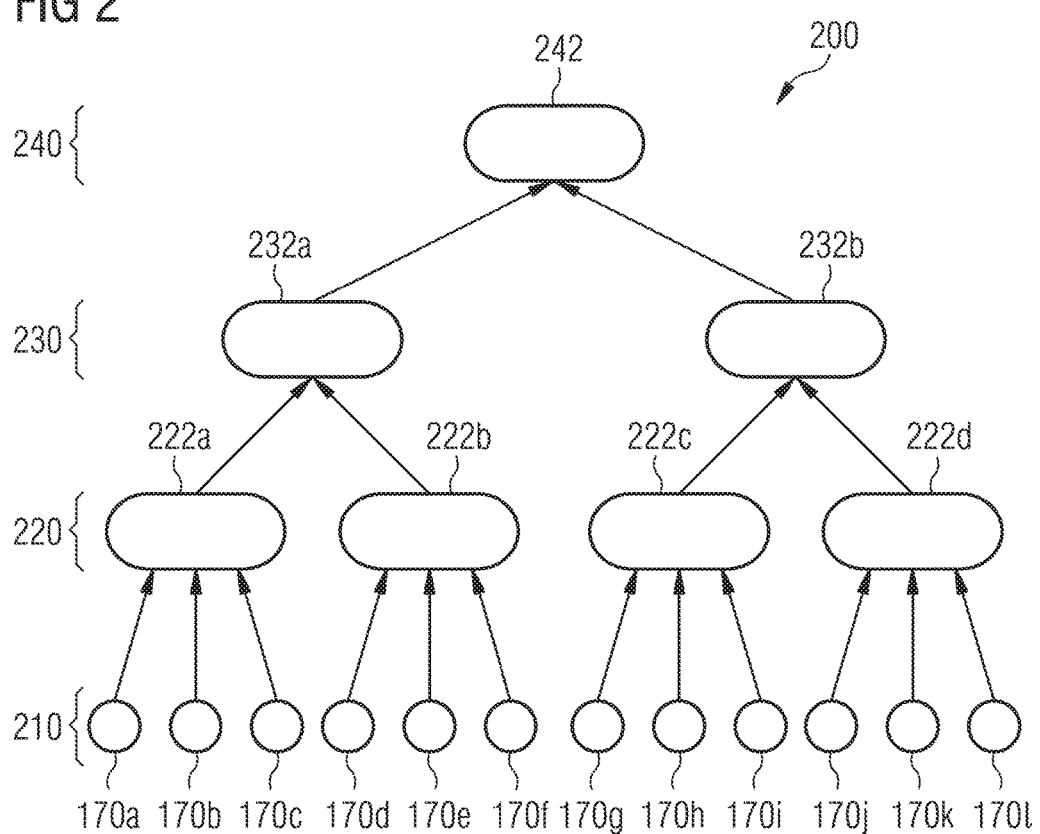

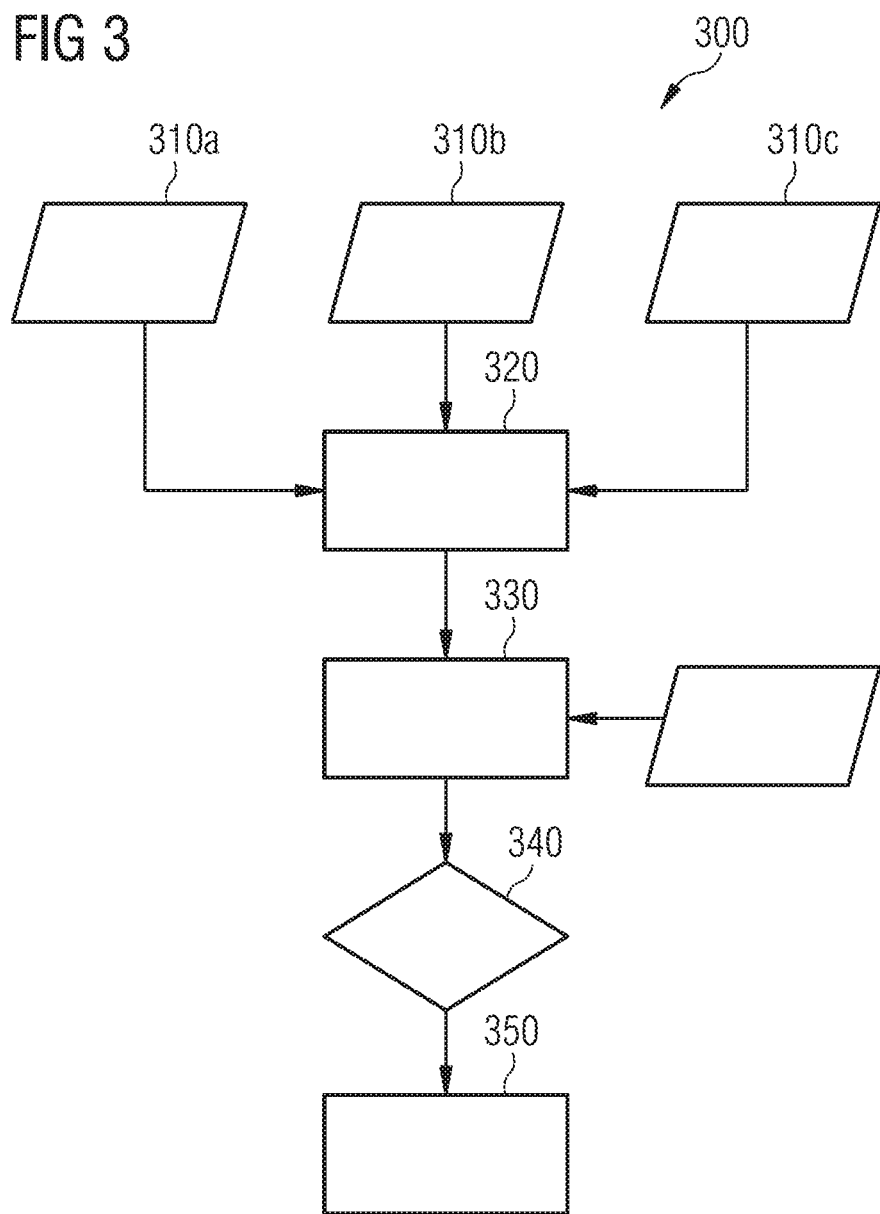

When there's alerts, the related tree expand automatically

After a tree is collapsed manually, when there's alert inside, the collapsed node will fresh to alert the user.

FIG 4C

Meaning:

- ○ Alerts inside — There's 1 or more alerts inside the structure
- ○ No alerts inside — There's 0 alerts inside the structure
- ● Alerts — Current alerts
- ⊚ No alerts now — It was an alert, but isn't now
- ○ Selected alert — Alert selected by user, the details will display at right side panel

FIG 5A

CREATE NEW ALERT ✕

[1] Setup Alert  [2] Select Trigger Point  [3] Setup Notification  [4] Sendig To Application Reading Alert
Electricity

| | |
|---|---|
| Alert Name | Test alert |
| Alert When Demand Is | Higher than ▽  2 ⇕ kw |
| Alert is Active | ⊙ |

[ Next ]

FIG 5B

CREATE NEW ALERT

[1] Setup Alert [2] Select Trigger Point [3] Setup Notification [4] Sendig To    ✕

Select point to trigger:
Select the points to trigger below and drag to the right panel to manage the trigger point list.

Filter By Building
[ISF Pokfulam ▽]

Search By Buildings

Total Points:

Points (17)

| | | |
|---|---|---|
| ⚡ | AC Unit / 1 sensors | Floor 2, Room 203  Pokfulam |
| ⚡ | Power Socket / 1 sensors | Floor 2, Room 203  Pokfulam |
| ⚡ | AC Unit / 5 sensors | Floor 2, Room 205  Pokfulam |
| ⚡ | AC Unit / 1 sensors | Floor 2, Room 207  Pokfulam |
| ⚡ | Power Socket / 5 sensors | Floor 2, Room 207  Pokfulam |
| ⚡ | AC Unit / 1 sensors | Pokfulam |

[Previous] [Next]

Alert will be trigger by:
Selected points: 8

| | | |
|---|---|---|
| ⚡ | Lighting / 2 sensors | Floor 2, Room 203  Pokfulam |
| ⚡ | Lighting / 2 sensors | Floor 2, Room 205  Pokfulam |
| ⚡ | Lighting / 2 sensors | Floor 2, Room 207  Pokfulam |
| ⚡ | Lighting / 2 sensors | Floor 5, Room 502  Pokfulam |
| ⚡ | Lighting / 2 sensors | Floor 5, Room 503  Pokfulam |
| ⚡ | Lighting / 2 sensors | Floor 5, Room 504  Pokfulam |
| ⚡ | Lighting / 2 sensors | Floor 5, Room 505  Pokfulam |
| ⚡ | Lighting / 2 sensors | Floor 5, Room 507  Pokfulam |

...

[Done]

FIG 5C

1 Setup Alert  2 Select Trigger Point  3 Setup Notification  4 Sendig To

Notification of Electricity application alert:
To set up new notification, please active the notification setup Notification is Active ⊙

Schedule notification times   [Always] [Schedule]

Monday [Off]
Tuesday [Off]
Wednesday [Off]
Thursday [All]
Friday [After] [05:00 PM]
Saturday [All]
Sunday [All]

Delay Notification [5] minutes
Do Not Re-alert me For [60] minutes

[Previous] [Next]   [Done]

ENERGY CONSUMPTION ALERTING SYSTEM, PLATFORM AND METHOD

TECHNICAL FIELD

The present invention relates to energy consumption measurement systems. In particular, the present invention relates to energy consumption alerting system, platform and method.

BACKGROUND

In conventional energy distribution networks, the energy consumption of a site is typically measured at a central supply point, e.g. an electricity meter installed between a supply line of an utility provider and a first distribution panel of a given site, for example a single building or a distinct part of a building such as an apartment or the like. In this way, all electrical energy consumed at that particular site can be measured, irrespective of the electrical distribution system of the given site.

The energy consumption measured at such a central supply point is usually used by the utility provider for billing purposes. Thus, at the end of a billing period such as a month or year, the utility provider usually prepares a utility bill based on the measured total consumption and provides it to the site manager or owner. Based on the provided utility bill, a site manager or owner can then determine whether he or she has stayed within a desirable energy budget or has exceeded it.

Such a conventional approach is sufficient for billing purposes. However, in times of high energy prices and a focus on energy efficiency, the data available in such a conventional scheme is insufficient in order to maintain a control over how the energy is actually consumed within a given site and also in order to estimate, at any given time, whether given energy targets will be met.

In addition to metering devices installed at a central supply point, individual metering devices are known. For example, an individual metering device may be plugged into a socket and supply energy to an individual electricity consumer, such as an electrical appliance. Such energy metering devices allow to measure the energy consumption of a particular appliance at a given location. However, such data is only available locally at the individual metering device. Thus, at least in sites comprising a relatively large number of electrical appliances and other electricity consumers, the use of such metering devices is both expensive and time consuming, if a building manager or owner wants to obtain a reasonably complete picture of the energy consumption of the site to be monitored.

Accordingly, there is a need for better systems and methods for monitoring the energy consumption at a particular site.

Preferably, such improved systems and methods should allow a manager or owner of a site to keep an up-to-date overview of the energy consumption and, moreover, allow him or her to be notified if an agreed energy consumption target is likely not to be met.

SUMMARY

According to one embodiment of the present invention, an energy consumption alerting system is described. The energy consumption alerting system comprises a plurality of sensors deployed at different locations of a monitored site, the sensors being configured to provide location-specific and appliance type energy consumption values. The system further comprises a data aggregation facility, configured to sum up at least two location-specific energy consumption values associated with at least two corresponding predetermined sensors of the plurality of sensors to obtain aggregated energy consumption value. Further, the system comprises an alerting facility configured to compare the aggregated energy consumption value with user-defined threshold level and to notify a user, if the aggregated energy consumption value exceeds the user-defined threshold level.

According to another embodiment of the present invention, a cloud-based energy consumption alerting platform is disclosed. The cloud-based energy consumption alerting platform comprises a data aggregation module configured to sum up at least two granular level, location-specific energy consumption values to obtain an aggregated energy consumption value. The at least two location-specific energy consumption values are associated with different, but co-related locations of a monitored site and provided to the cloud-based energy consumption alerting platform over a data network. Moreover, the cloud-based energy consumption alerting platform comprises an alerting facility configured to compare the aggregated energy consumption value with user-defined threshold level and to notify a user, if the aggregated energy consumption value exceeds the user-defined threshold level.

According to a further embodiment of the present invention, an energy consumption alerting method is provided. The method comprises obtaining a first granular level, location-specific energy consumption value from a first sensor deployed at a first location of a monitored site, and obtaining a second granular level, location-specific energy consumption value from a second sensor deployed at a second location of the monitored site. The first location-specific energy consumption value is added with the second location-specific energy consumption value to obtain an aggregated energy consumption value associated with a part of the building to be monitored. The aggregated energy consumption value is compared with an user-defined threshold level and a user notified if the aggregated energy consumption value exceeds the user-defined threshold level.

The various embodiments of the invention described above enable the implementation of an energy consumption alerting system, which allows a user to monitor the energy consumption associated with various parts of a site to be monitored based on an aggregation of data collected at a plurality of different locations by a plurality of sensors. In this way, user-defined energy consumption targets can be monitored with respect to parts of a relatively large site easily and without installing meters at various levels of the site, thus allowing a site operator or owner to enforce given energy consumption targets at a desired level of granularity.

BRIEF DESCRIPTION OF THE DRAWINGS

Various embodiments of the present invention will be described below with reference to the attached drawings. In the drawings, like reference symbols are used for like elements of different embodiments.

FIG. 2 shows a schematic diagram of a hierarchy of energy consumption values for an embodiment of the invention.

FIG. 3 shows a flow chart of an energy consumption alerting method in accordance with an embodiment of the invention.

FIGS. 4A to 4C show different views of a status display in accordance with an embodiment of the present invention.

FIGS. 5A to 5D show various views of a user interface used for setting up an alert in accordance with an embodiment of the present invention.

DETAILED DESCRIPTION OF ILLUSTRATIVE EMBODIMENTS

In various embodiments, the present invention relates to an energy consumption alerting system that can generate user-defined alarms based on an energy consumption of a site to be monitored. The embodiments of the present invention further relate to a cloud-based energy consumption alerting platform and an operating method, which can be used to implement such an alerting system.

Figure 1:
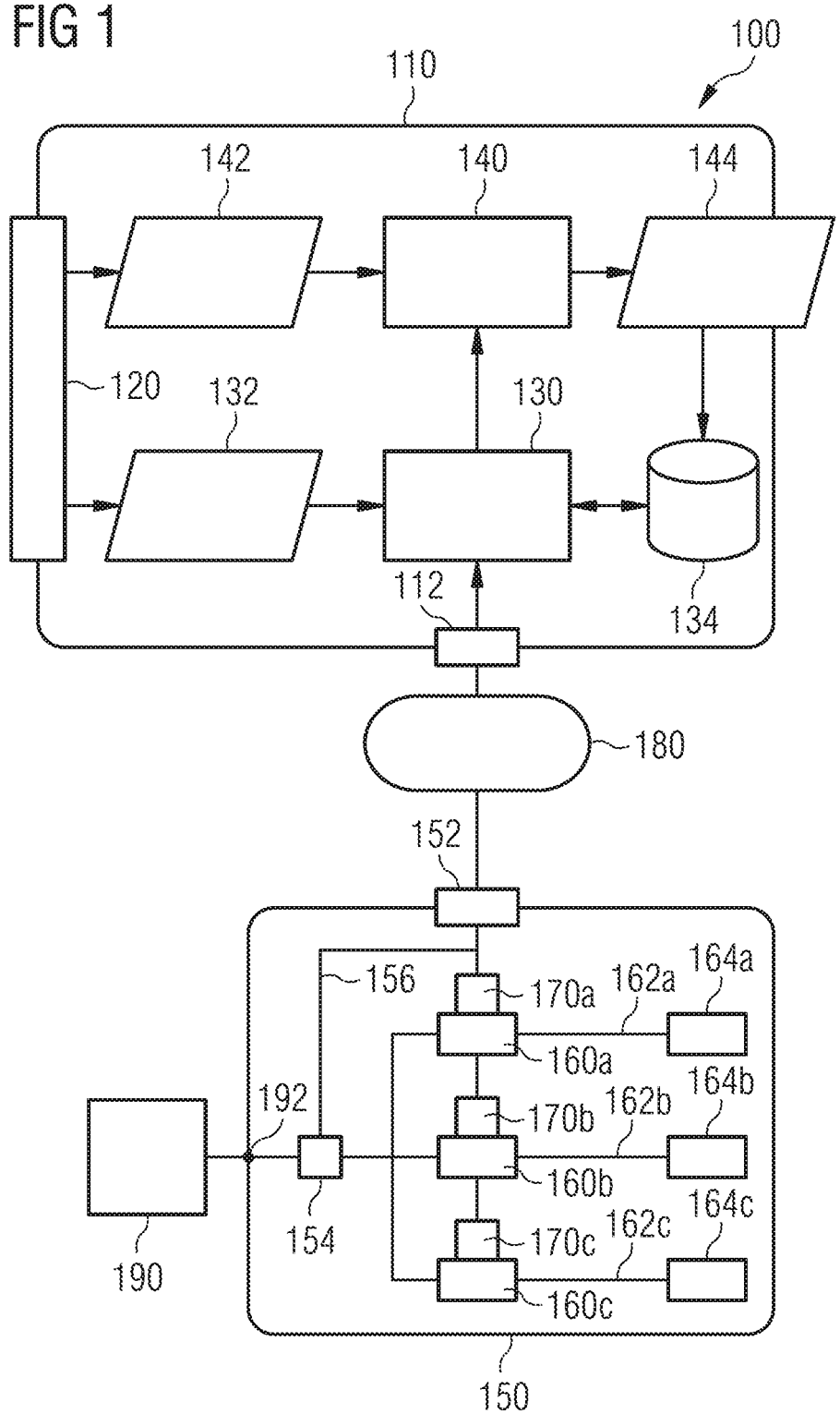
FIG. 1 shows a schematic diagram of an energy consumption alerting system in accordance with an embodiment of the invention.

FIG. 1 shows an energy consumption alerting system 100 according to an embodiment of the invention. The system 100 comprises an alerting platform 110 and a measuring system 150 connected thereto via a first gateway 112 and a second gateway 152 of a data network 180 such as the Internet.

The measuring system 150 is deployed at a site to be monitored, for example a single building or a group of buildings. In the depicted example, the site is supplied with electrical energy by a utility provider 190 at a central supply point 192. For example, the site may be connected to an energy distribution network of the utility provider 190 by a smart meter device 154. However, in an alternative embodiment, energy may be provided by multiple providers, multiple supply points and/or by multiple energy carriers to the monitored site.

Within the monitored site, the energy supplied by the utility provider 190 is distributed by a number of distribution panels (not shown). Typically, the energy provided to any specific end-point within the site to be monitored is provided via at least one distribution panel and protected by at least one circuit-breaker. In the example embodiment shown in FIG. 1, only three circuit-breakers 160a to 160c are shown for reasons of simplicity. However, attention is drawn to the fact that the monitored site may contains tens, hundreds or even thousands of distribution panels and circuit-breakers.

In the described embodiment, each of the circuit-breakers 160a to 160c has a corresponding sensor 170a to 170c assigned to it. The sensors 170 are placed on the circuit-breakers 160 in order to monitor the energy consumption of corresponding circuits 162a to 162c leading to electrical consumers 164a to 164c, respectively. In a different embodiment, the sensors 170 may be associated with individual appliances, groups of circuit-breakers, distribution panels or any other distinct part of the energy distribution network within the site to be monitored. Such sensors and the data they collect are respectively referred to as granular level sensors and granular level energy consumption values in the following.

The sensors 170, and optionally the smart meter device 154, are connected by a local area network 156. In this way, location-specific energy consumption values for the individual consumers 164 collected at granular level can be gathered and provided via the gateway 152, the data network 180 and the gateway 112 to the alerting platform 110.

Attention is drawn to the fact that the present invention is not restricted to the specific measuring system 150 disclosed in FIG. 1. For the purpose of the present invention, it is sufficient to provide relatively fine-grained granular-level energy consumption values for further analysis as detailed below. Such data may also be obtained by advanced data analysis of data provided by one or a few sensors associated with larger parts of a monitored site, rather than by a large number of sensors associated with individual circuits or energy consuming devices.

The alerting platform 110 comprises a data aggregation facility 130 as well as an alerting facility 140. The data aggregation facility 130 aggregates the location-specific energy consumption values provided by the sensors 170 of the measuring system 150 according to configuration data 132. For example, the configuration data 132 may comprise a hierarchical model of the site to be monitored as detailed below with respect to FIG. 2. Accordingly, the data aggregation facility 130 generates a number of aggregated energy consumption values, representing different parts of the site to be monitored. For example, the data aggregation facility 130 may aggregate all location-specific energy consumption values for a given room, level or a building within a monitored site. Alternatively, the data aggregation facility 130 may also combine location-specific energy consumption values of a given equipment type or room type, such as an aggregated energy consumption value related to lighting or an aggregated energy consumption value related to, for example, washrooms.

The alerting facility 140 compares the aggregated energy consumption values provided by the data aggregation facility 130 with one or more user-defined threshold levels 142. For example, the alerting facility 140 may monitor the total energy consumption of all heating, ventilation and air conditioning (HVAC) systems of a given site and compare their aggregated energy consumption with a user policy-based threshold level. Alternatively, the threshold level may be provided by the utility provider 190, in order to lower or stabilize the energy consumption across the entire energy supply network. Unlike in conventional systems, where a one-to-one correspondence between measurement values and thresholds exists, the user-defined threshold levels 142 according to the present invention may be flexibly associated with one or more aggregated energy consumption values not corresponding to any one sensor.

As shown in FIG. 1, the monitoring platform 110 may comprise one or several interfaces 120 to provide configuration data 132, user-defined threshold levels 142 or both from outside. As detailed below, the interface 120 may be used by a site operator or the utility provider 190 in order to control the behavior of the system 100.

If an aggregated energy consumption value lies below a corresponding user-defined threshold level 142, the data aggregation facility 130 and alerting facility 140 will typically not trigger any events and may proceed with monitoring further user-defined threshold levels 142 for other parts of the buildings. However, for some applications, a lower threshold level or a combination of a lower and upper threshold levels may be used for monitoring. If the alerting facility 140 identifies that a user-defined threshold level 142 is exceeded for any part of the site to be monitored, an alert message 144 in the form of a status update will be provided by the alerting platform 110. The alerting message 144 may be displayed within the alerting platform 110 or may be provided to an external system, such as an e-mail account of a site operator or owner or a web interface of a web service of a utility provider 190 for further processing.

Optionally, the alerting platform 110 may also comprise a storage facility 134 for storing the location-specific energy consumption values provided by the sensors 170 or the aggregated energy consumption values provided by the data aggregation facility 130. In addition or alternatively, the storage facility 134 may also be used to store the alert messages 144.

FIG. 2 shows a potential data model 200, which may be used as part of the configuration data 132 by the data aggregation facility 130. According to the data model 200, a plurality of sensors 170*a* to 170*l* are provided at an end node level 210. For example, one end node level sensor 170 may be provided for every appliance, circuit breaker, distribution rail, and/or distribution panel of a site to be monitored. According to a second level 220 of a hierarchy, groups of sensors 170 are aggregated to form four aggregated data points 222*a* to 222*d* at an area level 220. For example, a data point 222 for each room of a site to be monitored could be aggregated at the second level 220. In a third level 230 of the hierarchy, individual data points 222 from the second level 220 are aggregated to form two further data points 232*a* and 232*b*. For example, aggregated data points 232 corresponding to each floor level of a building could be computed. In a fourth level 240, a single further data point 242 is formed by adding the data point 232*a* and 232*b* of the third level 230. In this way, the total energy consumption of a building may be determined.

Attention is drawn to the fact that the hierarchy shown in FIG. 2 is only of exemplary nature and that further levels of the hierarchy may exist above or below the levels 210 to 240. Moreover, not all levels shown in FIG. 2 may be present in particular embodiments of the present invention. Furthermore, other location-specific information may be used in order to aggregate the data obtained at the end node level 210 in order to obtain meaningful aggregate data points according to one or multiple hierarchies.

FIG. 3 shows a flowchart of an exemplary method for operating the energy consumption alerting system 100 shown in FIG. 1 based on the data model shown in FIG. 2.

According to the method 300, at a first stage, location-specific energy consumption values for the sensors 170*a*, 170*b* and 170*c* are obtained in corresponding steps 310*a* to 310*c*. These data points may be obtained by sensors 170 attached to circuit breakers and provided over one or several data networks to a data aggregation facility 130.

In a step 320, based on the data model 200, the data aggregation facility 130 identifies that the provided location-specific energy consumption values of the sensors 170*a*, 170*b* and 170*c* belong to the same aggregate data point, for example a room corresponding to data point 222*a*. Thus, in a step 320, the individual consumption data obtained in step 310*a* to 310*c* are aggregated to form a room specific energy consumption level.

In a further step 330, the alerting facility 140 queries a configuration data base, whether user-specified threshold level for the room corresponding to data point 222*a* exits. In the given example, a user-defined threshold level exists for the data point 222*a*.

In a step 340, the aggregated energy consumption for the given room calculated in step 320 is compared with the user-defined threshold level determined in step 330.

If it is determine that the user-defined threshold level has been exceeded, an alert message is generated in step 350.

If, in step 330, it is established that no user-defined threshold level exists, or, in step 340, it is determined that the current aggregated energy consumption of a given data point lies below the user-defined threshold level for the corresponding part of the monitored site, the method proceeds with obtaining the next available energy consumption values for the sensors 170*a*, 170*b* and 170*c* or with processing energy consumption values of other end node level consumption values or aggregated data points 222, 232 or 242.

According to the described embodiment, the alerting facility 140 is implemented as a cloud-based web application. As part of the web application, the alerting platform 110 further comprises a user interface for configuring the alerting system 100 and for displaying alert messages 144.

Figure 4A:
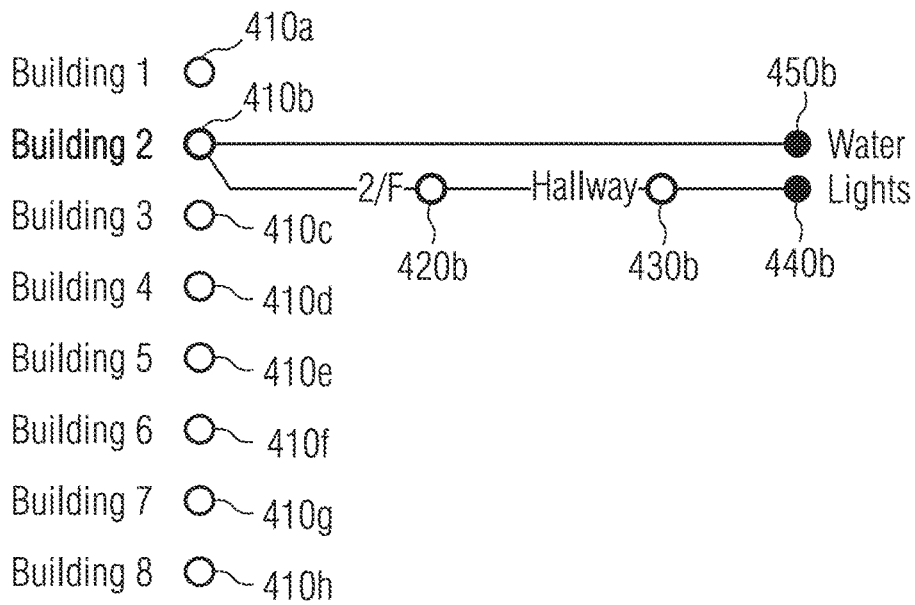
Figure 4B:
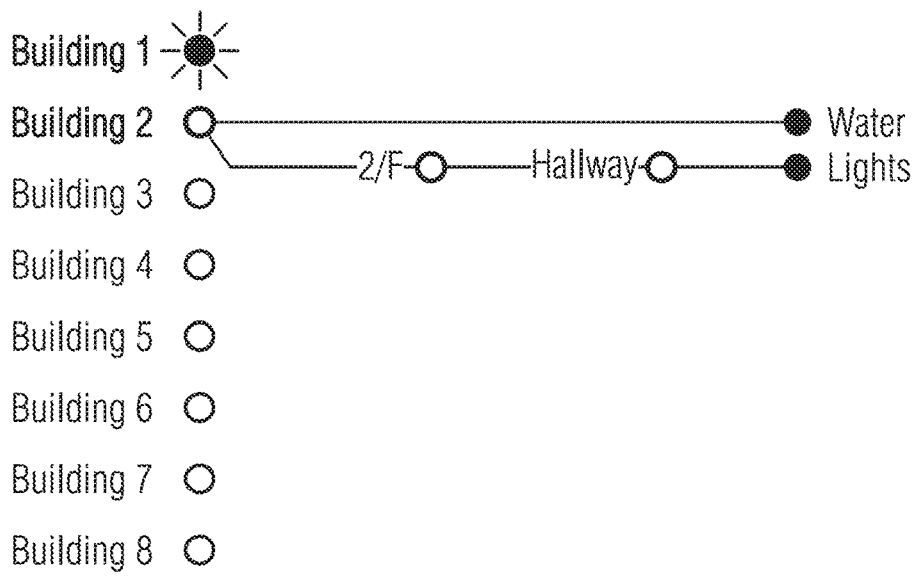

FIGS. 4A to 4C show two tree diagrams representing the hierarchy of the data model 200 including associated statuses based on corresponding user-defined threshold values together with a key to the displayed status elements.

FIG. 4A shows a first screenshot of the user interface for a site comprising eight buildings 410*a* to 410*h*. In the situation depictured in FIG. 4A, only the second building 410*b* has got any active alert. This is indicated in the user interface by a red hollow circuit at the node 410*a* representing the building 410*b*. When an alert is present, a corresponding tree of the location hierarchy is expanded automatically. In this way, similar tree nodes 420*b* and 430*b* representing the floor level and the affected room level are displayed. Moreover, based on the display of FIG. 4*a*, one can assess that two individual alarms associated with individual nodes 440*b* and 450*b* were triggered, one for the lights in the hallway of the second floor, and one for the water consumption at a building level.

As shown in FIG. 4B, even if a user of the system has manually collapsed a tree to the root node, for example the root node 410*a* corresponding to the first building, a flashing light at the highest hierarchy level will draw the user's attention to the fact that a new alarm was triggered within that part of the hierarchy.

FIGS. 5A to 5D show the steps required to set up a new alert in the alerting platform 110 according to an embodiment of the present invention. In a first step shown in FIG. 5A, a name of an alert is provided. Furthermore, a condition and a threshold level for the alarm to be triggered can be defined. Lastly, the alert can be activated or deactivated.

In a next step according to FIG. 5B, data points can be selected that will be associated with the alarm. At the stage, both a data point corresponding to an individual sensor 170 as well as an aggregated data point 222, 232 or 242 based on the data model 200 may be selected as a base for the trigger. Moreover, the same user-defined threshold level may be attached to a plurality of data points, for example in order to enforce a site-wide energy consumption policy.

In a third step according to FIG. 5C, a schedule for the new alarm can be defined. For example, the alarm may be enabled at any given time. Alternatively, the alarm may be only be active during business hours or outside of business hours. For example, while an energy consumption of the building lighting in excess of two kilowatts may be acceptable during working hours, a corresponding energy consumption outside of office working hours suggests that too many employees forgot to switch off their lights and, hence, an energy budget for that period is likely to be exceeded. In addition to the schedule itself, further parameters regarding the delay of a notification as well as the period for repeating the alarm may be configured in the user interface as shown in FIG. 5C.

Figure 5D:
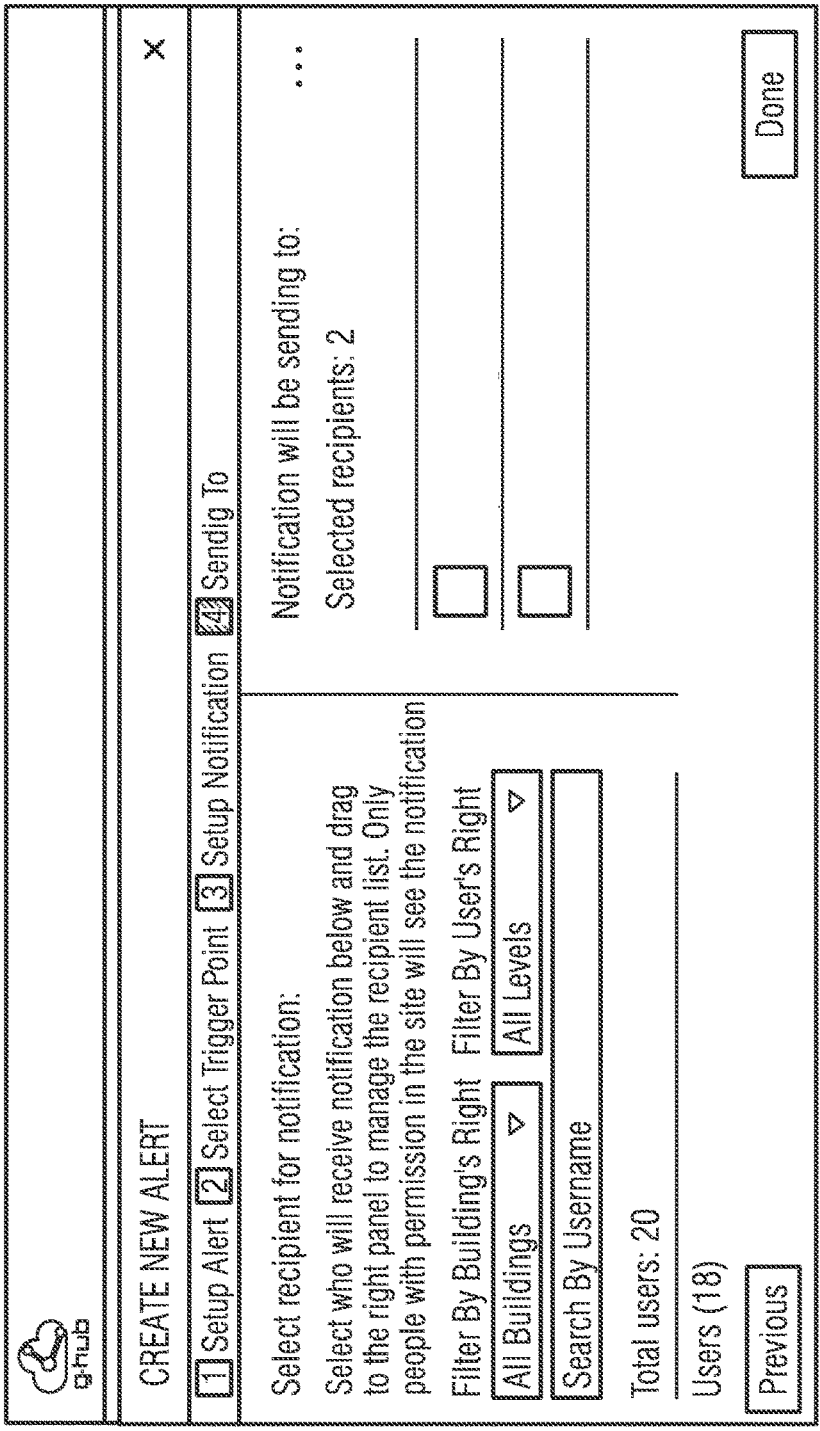

In a last step according to FIG. 5D, the recipients for any alarm message 144 in accordance with the generated alarm may be selected. In the example shown, the alerting platform 110 comprises a user management allowing the alarms to be distributed to one or several specific users. For example, a facility manager responsible for the corresponding part of the building may receive an alert notification in order to check up on any excessive energy consumption. In the example shown in FIG. 5D, the alert messages are distributed in the form of e-mail messages to conventional e-mail clients. Alternatively, the alert messages may be provided to individual users for example by use of a mobile app or a stationary interface installed at the site to be monitored.

In a possible use case, an energy consumption alerting system is used for controlling energy consumption of a site in accordance with an auto demand response (ADR) scheme pursuant to an advanced tariff of a utility provider.

According to such schemes, utility providers give financial or other incentives to site operators or owners in return for better control over energy consumption and thus better utilization of existing resources such as electricity plants or supply networks. Accordingly, the utility provider may provide one or several threshold levels for a maximal energy consumption of the entire site or specific parts or appliances of it, for example based on the current supply and demand of energy across an energy supply network. This information is used to configure a customer energy consumption alerting and control system, for example the system 100 shown in FIG. 1.

If the threshold levels provided by the utility provider are exceeded, a control system reduces the energy consumption of the monitored site, for example by deactivating or reducing an energy uptake of a HVAC system or lighting of a building in accordance with a predefined policy. In this way, the targets provided by the utility provider can be achieved, securing the financial or other incentives according to the ADR scheme to the owner or operator of the site.

According to the present invention, a user of the alerting platform 110 can flexibly set a consumption based alert based on different combinations of location-specific energy consumption values at a granular level. In consequence, the user does not need to install and maintain different metering device placed along different points of the energy distribution network, but only at a single, relatively low level, such as the circuit breaker level.

Moreover, the user can obtain a live picture of consumption data for different levels of granularity using data aggregation. For example, the alerting platform 110 can calculate the total floor consumption by summing up all the energy consumption values collected at the equipment level of each room of a site to be monitored. Of course, the energy consumption data received and processed by the alerting platform 110, can also be exported to a third party system, for example for equipment optimization.

Based on live monitoring, the user can determine and set specific threshold levels in order to trigger alarms to monitor the energy consumption of the building. Such alert can be used for triggering ADR schemes as detailed above. The inventive system also allows a user to set alerts and notifications for any parts of the building or site in order to enable a target-oriented energy saving strategy.

In addition, the energy consumption alerting system 100 allows a user to compare an estimated energy saving associated with a building upgrade, for example changing an existing lighting system to a more energy efficient lighting system, with the actual energy consumption of the building after the change. In this way, the efficiency of different measures improving overall energy efficiency may be assessed objectively in order to maximize a return on investment with respect to climate change mitigation technology.

What is claimed is:

1. An energy consumption alerting system comprising:

a plurality of sensors deployed at different locations of a monitored site, the sensors being configured to provide location-specific energy consumption values;

a data aggregation facility comprising hardware programmed to operate as a cloud-based web application and configured to sum up location-specific energy consumption values associated with corresponding predetermined sensors of the plurality of sensors to obtain an aggregated energy consumption value; and an alerting facility comprising hardware programmed to operate as a cloud-based web application and configured to compare the aggregated energy consumption value with an user-defined threshold level and to notify a user device, if the aggregated energy consumption value exceeds the user-defined threshold level, wherein the energy consumption alerting system is configured to monitor electrical energy consumption of the monitored site and each one of the plurality of sensors is attached to a circuit breaker associated with a corresponding electrical circuit of the monitored site, the sensors being configured to provide circuit-specific energy consumption values.

2. The energy consumption alerting system according to claim 1, further comprising:

a user interface facility comprising hardware programmed to operate as a cloud-based web application and configured to allow the user device to enter the user-defined threshold level.

3. The energy consumption alerting system according to claim 2, wherein the user interface facility is further configured to notify the user device, if the aggregated energy consumption value is exceeding the user-defined threshold level.

4. The energy consumption alerting system according to claim 3, wherein the user interface facility is further configured to display a hierarchical view of nodes associated with different levels of a hierarchy of the monitored site, each node indicating a current status associated with a corresponding part of the monitored site.

5. The energy consumption alerting system according to claim 2, wherein the user interface facility is further configured to display a hierarchy of the location-specific energy consumption values and the aggregated energy consumption value.

6. The energy consumption alerting system according to claim 1, wherein the data aggregation facility is configured to sum up the location-specific energy consumption values based on a hierarchical model of the monitored site based on at least one of a site level, a building level, a floor level, an apartment level, a room level, a room type level, and an equipment type level.

7. The energy consumption alerting system according to claim 1, further comprising:

a data export facility comprising hardware programmed to operate as a cloud-based web application and configured to export the aggregated energy consumption value, the user-defined threshold level, and a status of the energy consumption alerting system to a third party system for at least one of storage, billing, analysis, and optimization of the energy consumption of the monitored site.

8. The energy consumption alerting system according to claim 1, further comprising:
- an utility provider interface comprising hardware programmed to operate as a cloud-based web application and configured to receive a request according to an automatic demand response (ADR) scheme from a utility provider; and
- an ADR processing facility comprising hardware programmed to operate as a cloud-based web application and configured to set the user-defined threshold level in accordance with a request received via the utility provider interface.

9. The energy consumption alerting system according to claim 1, further comprising:
- an equipment control facility configured to reduce the energy consumption of an energy consuming equipment of the monitored site, if the aggregated energy consumption value exceeds the user-defined threshold level.

10. The energy consumption alerting system according to claim 1, wherein the plurality of sensors, the data aggregation facility, and alerting facility are connected to each other via a data network.

11. The energy consumption alerting system according to claim 1, wherein the data aggregation facility and the alerting facility are implemented as a cloud-based web application comprising a user interface for configuring the alerting facility and for displaying alert messages.

12. A cloud-based energy consumption alerting platform, comprising:
- a data aggregation module comprising hardware programmed to operate as a cloud-based web application and configured to sum up granular level, circuit breaker, location-specific energy consumption values to obtain an aggregated electrical energy consumption value representing a predefined part of a monitored site, the location-specific energy consumption values associated with different, co-related electrical circuits and locations of the monitored site and provided to the cloud-based energy consumption alerting platform over a data network; and
- an alerting facility comprising hardware programmed to operate as a cloud-based web application and configured to compare the aggregated electrical energy consumption value with an user-defined threshold level and to notify a user device, if the aggregated electrical energy consumption value representing the predefined part of the monitored site exceeds the user-defined threshold level.

13. The cloud-based energy consumption alerting platform according to claim 12, further comprising:
- a web-based user interface module comprising hardware programmed to operate as a cloud-based web application and configured to allow a user device to enter the user-defined threshold level and to notify the user device, if the aggregated electrical energy consumption value is exceeding the user-defined threshold level.

14. The cloud-based energy consumption alerting platform according to claim 13, wherein the web-based user interface module comprises at least one of the following:
- an interactive website, an app for a mobile device, a web service, and an automated messaging service.

15. The cloud-based energy consumption alerting platform according to claim 12, further comprising a plurality of sensors attached to a corresponding plurality of circuit breakers associated with the different, co-related electrical circuits of the monitored site, the sensors being configured to provide the granular, circuit breaker level, location-specific energy consumption values to the data aggregation module.

16. The cloud-based energy consumption alerting platform according to claim 12, wherein the data aggregation module aggregates all location-specific electrical energy consumption values for a given room, level or a building within the monitored site.

17. An energy consumption alerting method comprising:
- obtaining a first granular level, circuit- and location-specific energy consumption value from a first sensor attached to a first circuit breaker of an monitored site;
- obtaining a second granular level, circuit and location-specific energy consumption value from a second sensor attached to a second circuit breaker of the monitored site;
- adding the first circuit and location-specific energy consumption value and the second circuit and location-specific energy consumption value to obtain an aggregated electrical energy consumption value associated with a part of the monitored site;
- comparing the aggregated electrical energy consumption value with a user-defined threshold level; and
- notifying a user device if the aggregated electrical energy consumption value exceeds the user-defined threshold level, wherein the energy consumption alerting method is configured to monitor electrical energy consumption of the monitored site.

18. The energy consumption alerting method according to claim 17, further comprising:
- exporting at least one of the aggregated electrical energy consumption value, the user-defined threshold level, and a result of the comparison to a third party system for at least one of storage, billing, analysis, and optimization of the electrical energy consumption of the monitored site.

19. The energy consumption alerting method according to claim 17, further comprising:
- receiving a request according to an automatic demand response, ADR, scheme from a utility provider; and
- setting the user-defined threshold level in accordance with the received request.

20. The energy consumption alerting method according to claim 17, further comprising:
- reducing the electrical energy consumption of an energy-consuming equipment of the monitored site, if the aggregated electrical energy consumption value exceeds the user-defined threshold level.

\* \* \* \* \*